(12) United States Patent
Metz et al.

(10) Patent No.: US 7,212,048 B2
(45) Date of Patent: May 1, 2007

(54) MULTIPLE PHASE DETECTION FOR DELAY LOOPS

(75) Inventors: Peter C. Metz, Macungie, PA (US); Vladimir Sindalovsky, Perkasie, PA (US); Lane A. Smith, Easton, PA (US)

(73) Assignee: Agere Systems Inc., Allentown, PA (US)

( * ) Notice: Subject to any disclaimer, the term of this patent is extended or adjusted under 35 U.S.C. 154(b) by 33 days.

(21) Appl. No.: 11/138,703

(22) Filed: May 26, 2005

(65) Prior Publication Data

US 2006/0267635 A1 Nov. 30, 2006

(51) Int. Cl.
*H03L 7/06* (2006.01)
(52) U.S. Cl. .......... 327/149; 327/156; 327/161
(58) Field of Classification Search ............ 327/2, 327/3, 149, 158, 261, 285, 161–163
See application file for complete search history.

(56) References Cited

U.S. PATENT DOCUMENTS

| | | | | |
|---|---|---|---|---|
| 5,317,202 A | * | 5/1994 | Waizman | 327/156 |
| 5,815,016 A | * | 9/1998 | Erickson | 327/158 |
| 5,940,609 A | * | 8/1999 | Harrison | 713/503 |
| 6,342,796 B2 | * | 1/2002 | Jung | 327/141 |
| 6,424,193 B1 | * | 7/2002 | Hwang | 327/158 |
| 6,486,716 B1 | * | 11/2002 | Minami et al. | 327/152 |
| 6,559,062 B1 | * | 5/2003 | Downey et al. | 375/376 |
| 6,768,356 B1 | * | 7/2004 | Wu et al. | 327/156 |
| 6,853,226 B2 | * | 2/2005 | Kwak et al. | 327/159 |
| 6,867,627 B1 | * | 3/2005 | Murtagh | 327/158 |
| 7,035,366 B2 | * | 4/2006 | Tokutome et al. | 375/371 |

FOREIGN PATENT DOCUMENTS

WO   WO 97/14214   4/1997

* cited by examiner

*Primary Examiner*—Timothy P. Callahan
*Assistant Examiner*—Hai L. Nguyen

(57) ABSTRACT

A circuit (e.g., a receiver) has a delay loop (e.g., a voltage-controlled delay loop) and (at least) two phase detectors (PDs), where each PD compares a different pair of clock signals generated by the delay loop. The outputs of the different PDs are then used to generate a control signal for adjusting the delays provided by the delay elements in the delay loop. In one implementation, the control signal indicates that a delay adjustment should be made only if both PDs agree on that adjustment. This multiple-PD technique can reduce jitter that could otherwise result from a non-50% duty cycle in the reference clock signal used by the delay loop to generate its multiple clock signals.

28 Claims, 5 Drawing Sheets

MULTIPLE PHASE DETECTION FOR DELAY LOOPS

CROSS-REFERENCE TO RELATED APPLICATIONS

The subject matter of this application is related to U.S. patent application Ser. No. 10/999,889, filed on Nov. 30, 2004 as, the teachings of which are incorporated herein by reference.

The subject matter of this application is also related to U.S. patent application Ser. No. 11/138,777, filed on the same date as this application as, the teachings of which are incorporated herein by reference.

BACKGROUND OF THE INVENTION

1. Field of the Invention

The present invention relates to signal processing, and, in particular, to controlling phase in a delay loop, such as a voltage-controlled delay loop (VCDL) used to generate multiple sampling clock signals for sampling received data.

2. Description of the Related Art

Certain receivers that perform clock-and-data recovery (CDR) processing on their received signals employ a voltage-controlled delay loop having a plurality of sequentially arranged delay elements that generate multiple sampling clock signals used to sample data in the received signal. In order for such a receiver to operate properly, (1) the phases of the sampling clock signals should be phase-aligned with the data in the received signal and (2) the overall (i.e., bulk) delay of the VCDL should be the same as the period of the local reference clock signal used by the VCDL to generate the sampling clock signals. To achieve those goals, such receivers are typically designed with control loops that adjust the operations of the VCDL to ensure proper receiver operations. Failure to adequately control the VCDLs in such receivers can result in jitter in the sampling clock signals, which can adversely affect the results of the CDR processing.

SUMMARY OF THE INVENTION

Problems in the prior art are addressed in accordance with the principles of the present invention by implementing a receiver with a voltage-controlled delay loop and two phase detectors (PDs), where each PD compares a different pair of clock signals generated by the VCDL. The outputs of the different PDs are then used to generate a control signal for adjusting the delays provided by the VCDL delay elements. In one implementation, the control signal indicates that a delay adjustment should be made only if both PDs agree on that adjustment. This multiple-PD technique can reduce jitter that could otherwise result from a non-50% duty cycle in the reference clock signal used by the VCDL to generate its multiple clock signals.

In one embodiment, the present invention is circuitry comprising a delay loop, first and second phase detectors, and a comparator. The delay loop has a plurality of sequentially arranged delay elements, each adapted to generate a corresponding output clock signal. The first phase detector is adapted to characterize phase difference between a first pair of the output clock signals to generate a first phase-difference result. The second phase detector is adapted to characterize phase difference between a second pair of the output clock signals different from the first pair to generate a second phase-difference result. The comparator adapted to compare the first and second phase-difference results to generate a control signal for adjusting the delay elements.

In another embodiment, the present invention is a method for operating circuitry comprising a delay loop comprising a plurality of sequentially arranged delay elements, each adapted to generate a corresponding output clock signal. The method comprises (i) characterizing phase difference between a first pair of the output clock signals to generate a first phase-difference result; (ii) characterizing phase difference between a second pair of the output clock signals different from the first pair to generate a second phase-difference result; and (iii) comparing the first and second phase-difference results to generate a control signal for adjusting the delay elements.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

DETAILED DESCRIPTION

Figure 1:
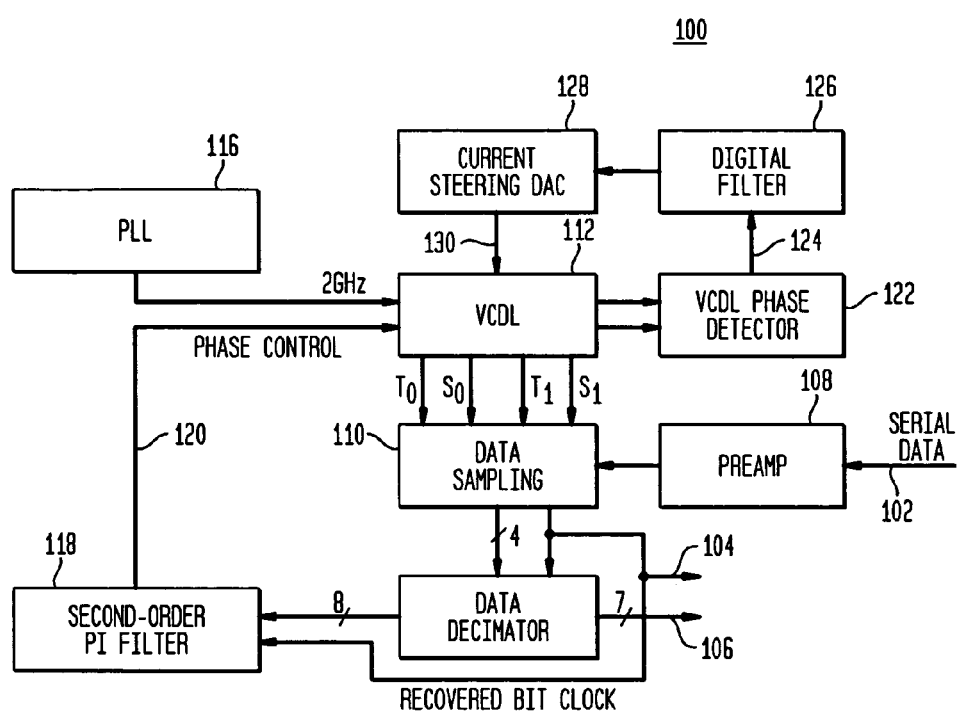
FIG. 1 shows a block diagram of a receiver that performs clock and data recovery (CDR) processing on a received serial data signal to recover a clock signal and a (parallel) data stream.

FIG. 1 shows a block diagram of receiver 100, which performs clock and data recovery (CDR) processing on a received serial data signal 102 to recover a clock signal 104 and a (parallel) data stream 106. In particular, serial data signal 102 is (optionally) pre-amplified (108) and sampled (110) to generate the data outputs. In this particular implementation, data sampler 110 over-samples the serial data signal by a factor of two (i.e., two samples per data bit in signal 102) using four sampling clock signals ($T_0, S_0, T_1, S_1$) generated by voltage-controlled delay loop (VCDL) 112 based on a PLL clock signal 114 received from phase-locked loop (PLL) 116. The four sampling clock signals are used by data sampler 110 to over-sample two consecutive data bits in data signal 102 by a factor of two. Further information about receiver 100 can be found in U.S. patent application Ser. No. 10/999,889, filed on Nov. 30, 2004 as, the teachings of which are incorporated herein by reference. Further information about VCDLs (also referred to as delay locked loops (DLLs)) can be found in PCT Patent Application No. WO 97/14214, published on Apr. 17, 1997, the teachings of which are also incorporated herein by reference. Note that, in other implementations of the present invention, clock signal 114 may be generated by a suitable high-speed clock source other than a PLL.

Figure 2:
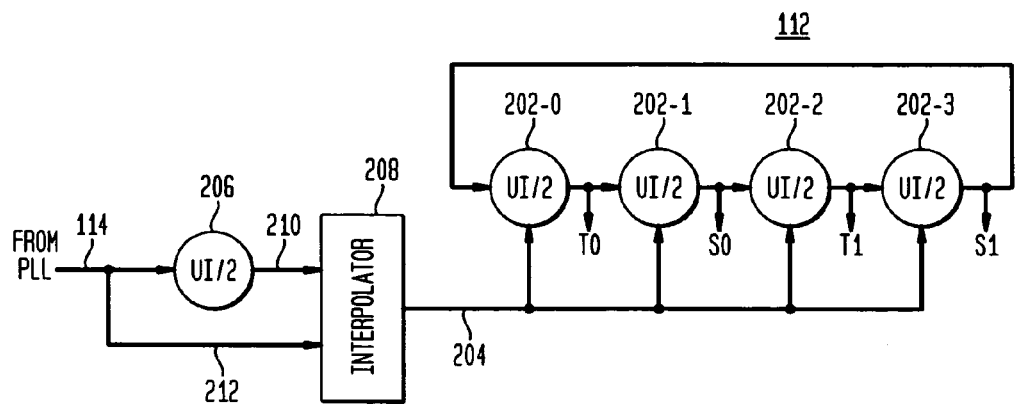
FIG. 2 shows a block diagram of the voltage-controlled delay loop (VCDL) of FIG. 1.

FIG. 2 shows a block diagram of voltage-controlled delay loop 112 of FIG. 1. VCDL 112 has a sequential arrangement of four delay elements 202-0, 202-1, 202-2, and 202-3, where:

the output of delay element 202-0 is sampling clock signal $T_0$, which is also applied to delay element 202-1;
the output of delay element 202-1 is sampling clock signal $S_0$, which is also applied to delay element 202-2;
the output of delay element 202-2 is sampling clock signal $T_1$, which is also applied to delay element 202-3; and
the output of delay element 202-3 is sampling clock signal $S_1$, which is also applied to delay element 202-0.

Figure 3:
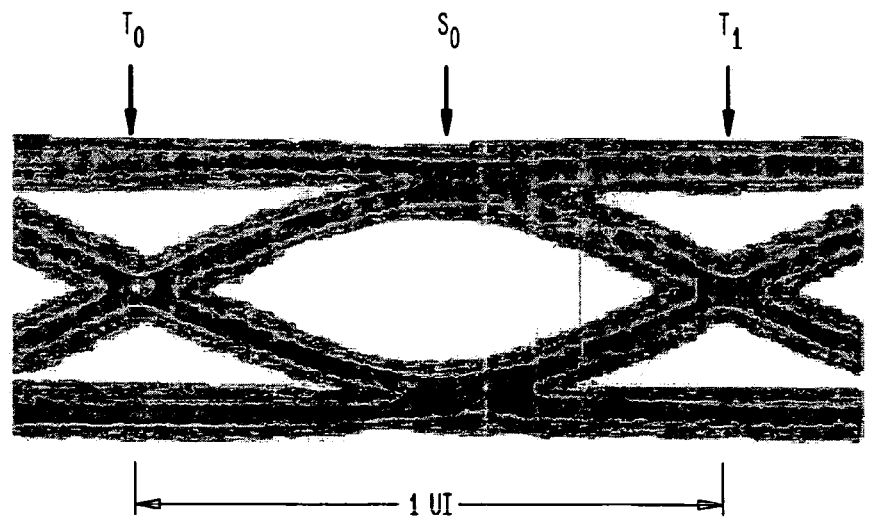
FIG. 3 shows a data-eye diagram representing ideal over-sampling of the data signal of FIG. 1 by a factor of two.

As indicated in FIG. 2, each delay element 202 delays the applied clock signal by one-half of a unit interval (UI), where one UI corresponds to the duration of a data bit in data signal 102 (see also FIG. 3).

FIG. 3 shows a data-eye diagram representing ideal over-sampling of data signal 102 by a factor of two, in which the data signal is sampled twice for each data bit in the data signal: once at the center of each bit and once at the transition between consecutive bits. In this ideal scenario, sampling clock signal $T_0$ is used to sample the transition preceding data bit i, sampling clock signal $S_0$ is used to sample the center of data bit i, sampling clock signal $T_1$ is used to sample the transition preceding data bit i+1, and sampling clock signal $S_1$ (not shown in FIG. 3) is used to sample the center of data bit i+1. Sampling clock signal $T_0$ would again be used to sample the transition preceding data bit i+2, and so on.

Ideally, (1) the four sampling clock signals ($T_0$, $S_0$, $T_1$, $S_1$) are phase-aligned with the bit transitions and centers of bits in data signal 102 as represented in FIG. 3 and (2) the bulk delay over the four delay elements 202 in VCDL 112 is equal to the period of PLL clock signal 114, such that each consecutive pair of sampling clock signals ($T_0$, $S_0$, $T_1$, $S_1$) are separated by UI/2. In real-world implementations, however, these two conditions cannot be guaranteed. As such, receiver 100 is implemented with two control loops: (1) a first control loop to adjust the operations of VCDL 112 for phase differences between the sampling clock signals and the data signal and (2) a second control loop to adjust the operations of VCDL 112 for differences between the period of PLL clock signal 114 and the VCDL bulk delay.

Referring again to FIG. 1, for the first control loop, second-order proportional/integral (PI) filter 118 generates phase control signal 120, which is used by VCDL 112 to control the phases of the four sampling clock signals generated by VCDL 112 relative to the data signal. For the second control loop, VCDL phase detector 122 compares two of the sampling clock signals (e.g., $S_0$ and $S_1$) and generates a digital control signal 124 representative of whether the delay between the two sampling clock signals is too small or too big relative to the period of PLL clock signal 114. For example, the delay may be less than a predetermined minimum threshold or greater than a predetermined maximum threshold wherein the minimum and maximum thresholds may be determined based on a performance metric for a given implementation. If the delay is too small, then phase detector 122 generates an up (UP) signal. If the delay is too big, then phase detector 122 generates a down (DN) signal. In one possible implementation, phase detector 122 always generates either an UP or a DN signal at each comparison. Digital UP/DN control signal 124 is filtered by digital filter 126 and then converted to the analog domain by current steering digital-to-analog converter (DAC) 128. The resulting current control signal 130 is applied to each delay element 202 in VCDL 112 to adjust (i.e., either increase or decrease) the input-to-output delay times of those elements.

First Control Loop

Referring again to FIG. 2, VCDL 112 has two mechanisms for adjusting the phases of sampling clock signals ($T_0$, $S_0$, $T_1$, $S_1$): a coarse mechanism and a fine mechanism, both of which are responsive to control signal 120 from PI filter 118. The coarse phase-adjustment mechanism is based on the ability to selectively inject clock signal 204 into any one of the four delay elements in VCDL 112. The fine phase-adjustment mechanism is based on the ability to selectively delay PLL clock signal 114 by any one of a number of different delay increments in order to generate clock signal 204.

In the embodiment of FIG. 2, the fine phase-adjustment mechanism is implemented using delay element 206 and interpolator 208. In one possible implementation, delay element 206 delays one version of PLL clock signal 114 by UI/2, where both delayed version 210 and undelayed version 212 are applied to interpolator 208, which is capable of selectively outputting any one of the following eight interpolated clock signals as clock signal 204:

Interpolated clock signal 0=PLL clock signal 114;
Interpolated clock signal 1=PLL clock signal 114 delayed by UI/16;
Interpolated clock signal 2=PLL clock signal 114 delayed by 2UI/16;
Interpolated clock signal 3=PLL clock signal 114 delayed by 3UI/16;
Interpolated clock signal 4=PLL clock signal 114 delayed by 4UI/16;
Interpolated clock signal 5=PLL clock signal 114 delayed by 5UI/16;
Interpolated clock signal 6=PLL clock signal 114 delayed by 6UI/16; and
Interpolated clock signal 7=PLL clock signal 114 delayed by 7UI/16.

In other implementations, other sets of interpolated clock signals may be available, and, in other embodiments, other types of circuitry may be employed to generate delayed clock signal 210.

The coarse phase-adjustment mechanism of VCDL 112 is represented in FIG. 2 by clock signal 204 being connected to each delay element 202. Within each delay element 202 is switch circuitry (not shown) that selectively enables clock signal 204 to be injected into one of the delay elements for initial delay and subsequent propagation through the rest of the delay elements. As such, each delay element 202 is capable of selecting either clock signal 204 or the output of the previous delay element as its input. The switch circuitry is controlled based on phase control signal 120 of FIG. 1.

For example, if clock signal 204 is selected to be injected into delay element 202-0, then delay element 202-0 delays clock signal 204 by UI/2 to generate sampling clock signal $T_0$, which is itself applied to delay element 202-1, which delays sampling clock signal $T_0$ by another UI/2 to generate sampling clock signal $S_0$, which is itself applied to delay element 202-2, which delays sampling clock signal $S_0$ by another UI/2 to generate sampling clock signal $T_1$, which is itself applied to delay element 202-3, which delays sampling clock signal $T_1$ by another UI/2 to generate sampling clock signal $S_1$. Note that, in this configuration, sampling clock signal $S_1$ is not selected as an input to delay element 202-0.

If, however, clock signal 204 is selected to be injected into delay element 202-1, then delay element 202-1 delays clock signal 204 by UI/2 to generate sampling clock signal $S_0$, which is itself applied to delay element 202-2, which delays sampling clock signal $S_0$ by another UI/2 to generate sampling clock signal $T_1$, which is itself applied to delay element 202-3, which delays sampling clock signal $T_1$ by another UI/2 to generate sampling clock signal $S_1$, which is itself applied to delay element 202-0, which delays sampling clock signal $S_1$ by another UI/2 to generate sampling clock signal $T_0$. Note that, in this configuration, sampling clock signal $T_0$ is not selected as an input to delay element 202-1. Analogous processing occurs if clock signal 204 is selected to be injected into delay element 202-2 or 202-3.

Figure 4:
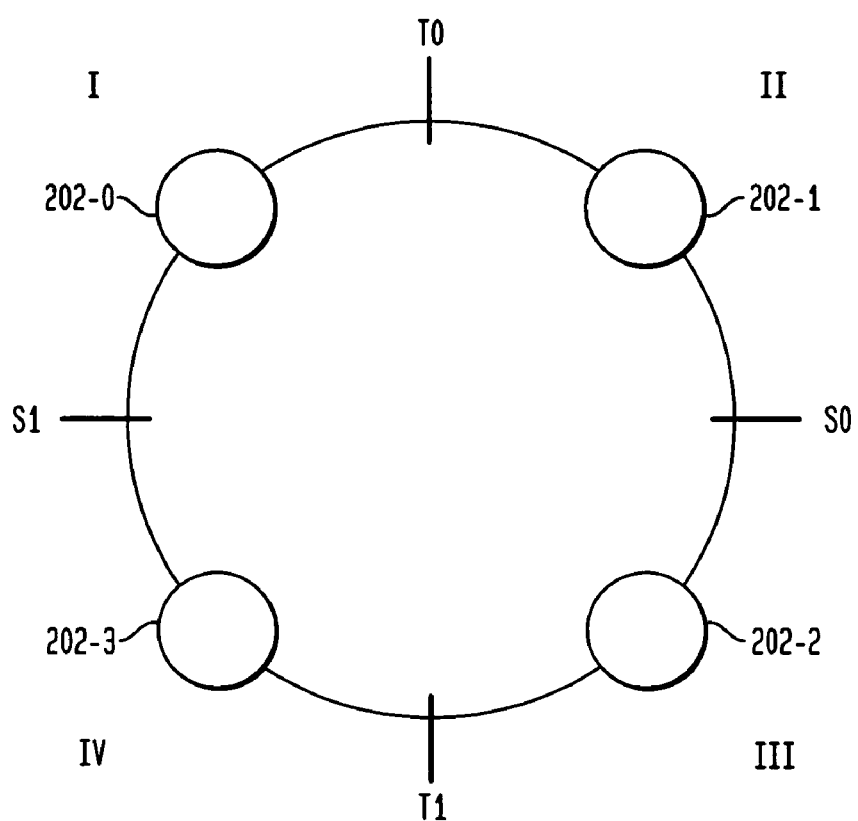
FIG. 4 shows a representation of the possible injection points within the VCDL of FIG. 2.

FIG. 4 shows a representation of the four possible injection points within VCDL 112 of FIG. 2, where injection into delay element 202-0 corresponds to Quadrant I, injection into delay element 202-1 corresponds to Quadrant II, injection into delay element 202-2 corresponds to Quadrant III, and injection into delay element 202-3 corresponds to Quadrant IV. In one implementation of VCDL 112, the coarse phase-adjustment mechanism is limited to changing the injection point by only one delay element. As such, if delay element 202-0 is the current injection point, then the coarse mechanism can change the next injection point to be either the immediately preceding delay element (i.e., delay element 202-3) or the immediately following delay element (i.e., delay element 202-1), but not delay element 202-2. And, similarly, when any of the other three delay elements is the current injection point.

Second Control Loop

As described earlier, VCDL phase detector 122 of FIG. 1 compares sampling clock signals $S_0$ and $S_1$ to determine whether the delay between those two sampling clock signals is too big or too small. Ideally, where the period of PLL clock signal 114 is 2 UI and each delay element corresponds to UI/2, clock signal $S_0$ would be 180 degrees out of phase with clock signal $S_1$, such that each rising edge of $S_0$ aligns in time to a falling edge of $S_1$ and each falling edge of $S_0$ aligns in time to a rising edge of $S_1$. When the delay between those clock signals is not exactly UI/2, then the rising and falling edges will not coincide, and sampling one clock signal at the falling (or rising) edge of the other can be used to determine whether the delay between the two clock signals is too big or too small.

When the injection point is in the upper half of FIG. 4 (i.e., injection at either delay element 202-0 in Quadrant I or delay element 202-1 in Quadrant II), sampling clock signal $S_0$ will lead sampling clock signal $S_1$ (because, in both of these two cases, $S_1$ is a delayed version of $S_0$). However, when the injection point is in the bottom half of FIG. 4 (i.e., injection at either delay element 202-2 in Quadrant III or delay element 202-3 in Quadrant IV), sampling clock signal $S_1$ will lead sampling clock signal $S_0$ (because, in both of these two cases, $S_0$ is a delayed version of $S_1$).

Figure 5:
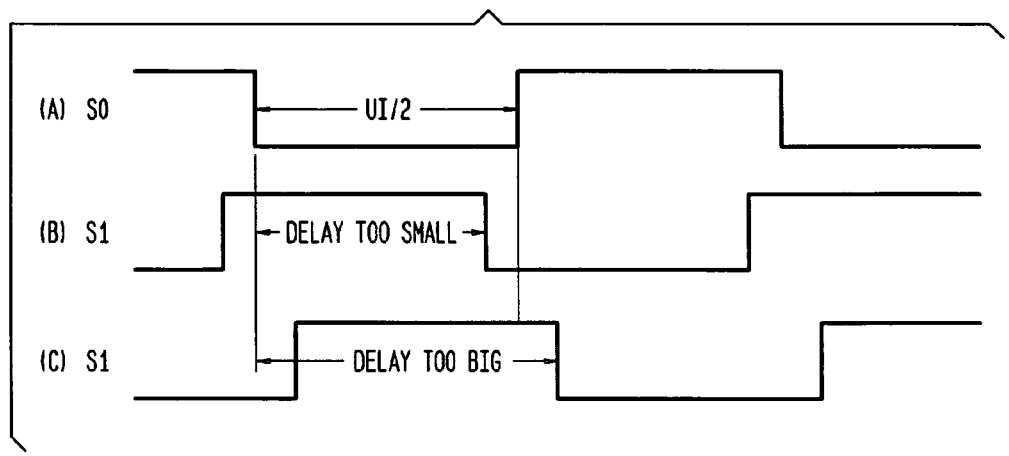
FIG. 5 shows a timing diagram for sampling clock signal $S_0$ leading sampling clock signal $S_1$.

FIG. 5 shows a timing diagram for situations in which sampling clock signal $S_0$ leads sampling clock signal $S_1$. In these situations, phase detector 122 of FIG. 1 is configured to detect the level of clock signal $S_1$ at a rising edge of clock signal $S_0$. As shown in FIG. 5(b), if $S_1$ is low at the rising edge of $S_0$, then the delay between $S_0$ and $S_1$ is too small, and phase detector 122 generates an UP control signal 124. As shown in FIG. 5(c), if $S_1$ is high at the rising edge of $S_0$, then the delay between $S_0$ and $S_1$ is too big, and phase detector 122 generates a DN control signal 124.

Figure 6:
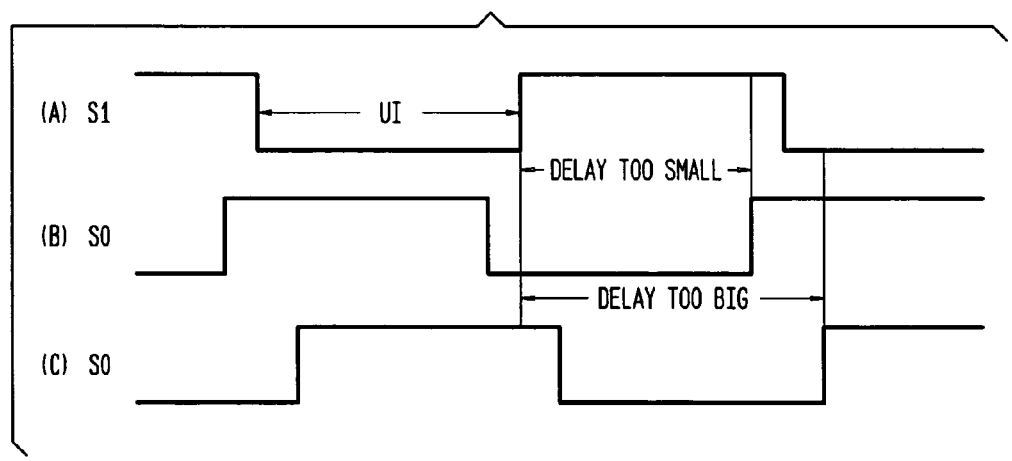
FIG. 6 shows a timing diagram for sampling clock signal $S_1$ leading sampling clock signal $S_0$.

FIG. 6 shows a timing diagram for situations in which sampling clock signal $S_1$ leads sampling clock signal $S_0$. In these situations, phase detector 122 of FIG. 1 still detects the level of clock signal $S_1$ at a rising edge of clock signal $S_0$. As shown in FIG. 6(b), if $S_1$ is high at the rising edge of $S_0$, then the delay between $S_1$ and $S_0$ is too small, and phase detector 122 generates an UP control signal 124. As shown in FIG. 6(c), if $S_1$ is low at the rising edge of $S_0$, then the delay between $S_1$ and $S_0$ is too big, and phase detector 122 generates a DN control signal 124.

In FIG. 5, the low half of the PLL clock signal is used for phase detection, while, in FIG. 6, the high half of the PLL clock signal is used for phase detection. FIGS. 5 and 6 correspond to a situation in which the duty cycle of the PLL clock signal used to generate sampling clock signals $S_0$ and $S_1$ has an ideal 50% duty cycle. In real implementations, however, the duty cycle of the PLL clock signal may vary from 50%. In the absence of the present invention, such asymmetric duty cycles could lead to bimodal control, where the delay adjustment of the bulk delay is twice the low half of the PLL clock signal when injection is in either Quadrant I or II of FIG. 4, while the delay adjustment will be twice the high half of the PLL clock signal when injection is in either Quadrant III or IV of FIG. 4. As such, when the injection point moves from Quadrants I or II to Quadrants III or IV, or vice versa, the bulk delay will tend to jump between two different values (assuming a non-50% duty cycle). Such bimodal control causes the VCDL delay to change in time, resulting in jitter, which degrades the quality of the VCDL. In particular, the delay adjustment will change every time that the injection point crosses from the upper half of FIG. 4 to the lower half, and vice versa. The fact that the injection point in VCDL 112 can be continuously changing also makes it difficult to use the phase detector for control of the delay value of each stage of the VCDL in order to keep intervals between sampling clock signals equal to a pre-defined portion of a unit interval.

Figure 7:
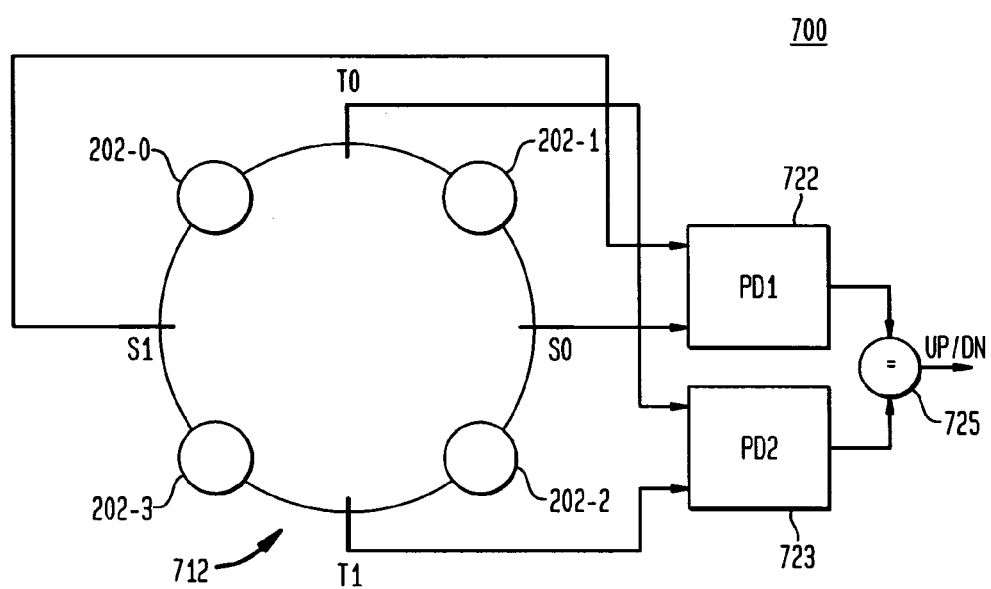
FIG. 7 shows a diagram representing a portion of a CDR receiver having a VCDL, in which two phase detectors (PDs) are employed.

FIG. 7 shows a diagram representing a portion of a CDR receiver 700 having VCDL 712, in which two phase detectors (PDs) are employed: a first PD 722 (e.g., an in-phase PD), which compares sampling clock signals $S_0$ and $S_1$ similar to PD 122 of FIG. 1, and a second PD 723 (e.g., a quadrature-phase PD), which compares sampling clock signals $T_0$ and $T_1$ in a manner analogous to that represented in FIGS. 5 and 6 for PD 122. In addition, CDR receiver 700 has comparator 725, which compares the signals generated by PDs 722 and 723. If both PDs generate UP signals, then comparator 725 provides an UP signal to a digital filter (not shown) analogous to filter 126 of FIG. 1. Similarly, if both PDs generate DN signals, then comparator 725 provides a DN signal to the digital filter. If the PDs do not agree (i.e., one generates an UP signal and the other a DN signal), then comparator 725 will provide a null signal to the digital filter. Alternatively, when the PDs do not agree, comparator 725 could provide whatever signal it previously provided to the digital filter.

The use of in-phase and quadrature-phase PDs in the configuration of FIG. 7 can reduce errors in VCDL delay control that might otherwise occur due to asymmetry in the clock duty cycle, thereby reducing jitter in the sampling clock signals.

Although the present invention has been described in the context of a receiver having two 180-degree phase detectors, the present invention is not so limited. For example, a receiver having a VCDL with more than four delay elements (e.g., eight) could have more than two 180-degree PDs (e.g., four PDs with one 180-degree PD for each corresponding pair of delay elements).

Although the present invention has been described in the context of a digital implementation in which the phase detectors generate digital outputs that are filtered and D/A converted to generate analog control signals for the VCDL, other implementations are possible. For example, the phase detectors could generate analog outputs that are filtered in the analog domain before being applied to control the VCDL.

The present invention may be implemented as circuit-based processes, including possible implementation as a single integrated circuit (such as an ASIC or an FPGA), a multi-chip module, a single card, or a multi-card circuit pack. As would be apparent to one skilled in the art, various functions of circuit elements may also be implemented as processing steps in a software program. Such software may be employed in, for example, a digital signal processor, micro-controller, or general-purpose computer.

The present invention can be embodied in the form of methods and apparatuses for practicing those methods. The present invention can also be embodied in the form of program code embodied in tangible media, such as floppy diskettes, CD-ROMs, hard drives, or any other machine-readable storage medium, wherein, when the program code is loaded into and executed by a machine, such as a computer, the machine becomes an apparatus for practicing the invention. The present invention can also be embodied in the form of program code, for example, whether stored in a storage medium, loaded into and/or executed by a machine, or transmitted over some transmission medium or carrier, such as over electrical wiring or cabling, through fiber optics, or via electromagnetic radiation, wherein, when the program code is loaded into and executed by a machine, such as a computer, the machine becomes an apparatus for practicing the invention. When implemented on a general-purpose processor, the program code segments combine with the processor to provide a unique device that operates analogously to specific logic circuits.

Unless explicitly stated otherwise, each numerical value and range should be interpreted as being approximate as if the word "about" or "approximately" preceded the value of the value or range.

It will be further understood that various changes in the details, materials, and arrangements of the parts which have been described and illustrated in order to explain the nature of this invention may be made by those skilled in the art without departing from the scope of the invention as expressed in the following claims.

Although the steps in the following method claims, if any, are recited in a particular sequence with corresponding labeling, unless the claim recitations otherwise imply a particular sequence for implementing some or all of those steps, those steps are not necessarily intended to be limited to being implemented in that particular sequence.

We claim:

1. Circuitry comprising:
a delay loop having a plurality of sequentially arranged delay elements, each adapted to generate a corresponding output clock signal, wherein the delay loop forms a closed loop in which each delay element in the delay loop is connected to (1) receive an upstream output clock signal from a previous delay element in the delay loop and (2) provide a downstream output clock signal to a subsequent delay element in the delay loop;
a first phase detector adapted to characterize phase difference between a first pair of the output clock signals to generate a first phase-difference result;
a second phase detector adapted to characterize phase difference between a second pair of the output clock signals different from the first pair to generate a second phase-difference result; and
a comparator adapted to compare the first and second phase-difference results to generate a control signal for adjusting delay of each delay element.

2. The circuitry of claim 1, wherein the comparator is adapted to generate the control signal to:
increase the delay applied by the delay elements if the first and second phase-difference results indicate that the delay should be increased; and
decrease the delay if the first and second phase-difference results indicate that the delay should be decreased.

3. The circuitry of claim 2, wherein the comparator is adapted to generate a null control signal if the first and second phase-difference results do not agree.

4. The circuitry of claim 2, wherein the comparator is adapted to repeat a previous control signal if the first and second phase-difference results do not agree.

5. The circuitry of claim 1, further comprising a filter adapted to filter the control signal generated by the comparator.

6. The circuitry of claim 5, wherein:
the control signal is a digital control signal;
the filter is a digital filter adapted to digitally filter the digital control signal generated by the comparator; and
further comprising a digital-to-analog converter adapted to convert the filtered digital control signal into an analog current control signal used to control the delays by the delay elements.

7. The circuitry of claim 1, wherein:
the delay loop is part of a receiver;
the output clock signals from the delay elements are adapted to be used to sample a data signal received by the receiver; and
the delay loop is adapted to control the delays by the delay elements in order to match bulk delay of the delay elements with a period of an input clock signal applied to the delay loop.

8. The circuitry of claim 1, wherein:
the comparator is adapted to generate the control signal to:
increase the delay applied by the delay elements if the first and second phase-difference results indicate that the delay should be increased; and
decrease the delay if the first and second phase-difference results indicate that the delay should be decreased;
the comparator is adapted to generate a null control signal if the first and second phase-difference results do not agree;
further comprising:
a digital filter adapted to filter the control signal generated by the comparator; and
a digital-to-analog converter adapted to convert the filtered control signal into an analog current control signal used to control the delays by the delay elements;
the delay loop is part of a receiver;
the output clock signals from the delay elements are adapted to be used to sample a data signal received by the receiver; and
the delay loop is adapted to control the delays by the delay elements in order to match bulk delay of the delay elements with a period of an input clock signal applied to the delay loop.

9. The circuitry of claim 1, wherein the first and second pairs of output clock signals do not have any output clock signal in common.

10. A method for operating circuitry comprising a delay loop comprising a plurality of sequentially arranged delay elements, each adapted to generate a corresponding output clock signal, wherein the delay loop forms a closed loop in which each delay element in the delay loop is connected to (1) receive an upstream output clock signal from a previous delay element in the delay loop and (2) provide a downstream output clock signal to a subsequent delay element in the delay loop, the method comprising:
characterizing phase difference between a first pair of the output clock signals to generate a first phase-difference result;
characterizing phase difference between a second pair of the output clock signals different from the first pair to generate a second phase-difference result; and
comparing the first and second phase-difference results to generate a control signal for adjusting delay of each delay element.

11. The method of claim 10, wherein:
the delay loop is part of a receiver;
the output clock signals from the delay elements are used to sample a data signal received by the receiver; and
the delay loop is adapted to control the delays by the delay elements in order to match bulk delay of the delay elements with a period of an input clock signal applied to the delay loop.

12. The method of claim 10, wherein:
the control signal is generated to:
increase the delay applied by the delay elements if the first and second phase-difference results indicate that the delay should be increased; and
decrease the delay if the first and second phase-difference results indicate that the delay should be decreased;
a null control signal is generated if the first and second phase-difference results do not agree;
further comprising:
filtering the control signal; and
converting the filtered control signal into an analog current control signal used to control the delays by the delay elements;
the delay loop is part of a receiver;
the output clock signals from the delay elements are used to sample a data signal received by the receiver; and
the delay loop controls the delays by the delay elements in order to match bulk delay of the delay elements with a period of an input clock signal applied to the delay loop.

13. The method of claim 10, further comprising filtering the control signal generated by the comparator.

14. The method of claim 13, wherein:
the control signal is a digital control signal;
the filtering is digital filtering of the digital control signal; and
further comprising converting the filtered digital control signal into an analog current control signal used to control the delays by the delay elements.

15. The method of claim 10, wherein the control signal is generated to:
increase the delay applied by the delay elements if the first and second phase-difference results indicate that the delay should be increased; and
decrease the delay if the first and second phase-difference results indicate that the delay should be decreased.

16. The method of claim 15, wherein a null control signal is generated if the first and second phase-difference results do not agree.

17. The method of claim 15, wherein a previous control signal is repeated if the first and second phase-difference results do not agree.

18. The method of claim 10, wherein the first and second pairs of output clock signals do not have any output clock signal in common.

19. Circuitry comprising:
a delay loop having a plurality of sequentially arranged delay elements, each adapted to generate a corresponding output clock signal;
a first phase detector adapted to characterize phase difference between a first pair of the output clock signals to generate a first phase-difference result;
a second phase detector adapted to characterize phase difference between a second pair of the output clock signals different from the first pair to generate a second phase-difference result; and
a comparator adapted to compare the first and second phase-difference results to generate a control signal for adjusting delay of each delay element, wherein:
the comparator is adapted to generate the control signal to:
increase the delay applied by the delay elements if the first and second phase-difference results indicate that the delay should be increased; and
decrease the delay if the first and second phase-difference results indicate that the delay should be decreased; and
the comparator is adapted to generate a null control signal if the first and second phase-difference results do not agree.

20. Circuitry comprising:
a delay loop having a plurality of sequentially arranged delay elements, each adapted to generate a corresponding output clock signal;
a first phase detector adapted to characterize phase difference between a first pair of the output clock signals to generate a first phase-difference result;
a second phase detector adapted to characterize phase difference between a second pair of the output clock signals different from the first pair to generate a second phase-difference result; and
a comparator adapted to compare the first and second phase-difference results to generate a control signal for adjusting delay of each delay element, wherein:
the comparator is adapted to generate the control signal to:
increase the delay applied by the delay elements if the first and second phase-difference results indicate that the delay should be increased; and
decrease the delay if the first and second phase-difference results indicate that the delay should be decreased; and
the comparator is adapted to repeat a previous control signal if the first and second phase-difference results do not agree.

21. Circuitry comprising:
a delay loop having a plurality of sequentially arranged delay elements, each adapted to generate a corresponding output clock signal;
a first phase detector adapted to characterize phase difference between a first pair of the output clock signals to generate a first phase-difference result;
a second phase detector adapted to characterize phase difference between a second pair of the output clock signals different from the first pair to generate a second phase-difference result;

a comparator adapted to compare the first and second phase-difference results to generate a control signal for adjusting delay of each delay element; and a filter adapted to filter the control signal generated by the comparator.

22. The circuitry of claim 21, wherein:

the control signal is a digital control signal;

the filter is a digital filter adapted to digitally filter the digital control signal generated by the comparator; and further comprising a digital-to-analog converter adapted to convert the filtered digital control signal into an analog current control signal used to control the delays by the delay elements.

23. Circuitry comprising:

a delay loop having a plurality of sequentially arranged delay elements, each adapted to generate a corresponding output clock signal;

a first phase detector adapted to characterize phase difference between a first pair of the output clock signals to generate a first phase-difference result;

a second phase detector adapted to characterize phase difference between a second pair of the output clock signals different from the first pair to generate a second phase-difference result; and a comparator adapted to compare the first and second phase-difference results to generate a control signal for adjusting delay of each delay element, wherein:

the delay loop is part of a receiver;

the output clock signals from the delay elements are adapted to be used to sample a data signal received by the receiver; and the delay loop is adapted to control the delays by the delay elements in order to match bulk delay of the delay elements with a period of an input clock signal applied to the delay loop.

24. A method for operating circuitry comprising a delay loop comprising a plurality of sequentially arranged delay elements, each adapted to generate a corresponding output clock signal, the method comprising:

characterizing phase difference between a first pair of the output clock signals to generate a first phase-difference result;

characterizing phase difference between a second pair of the output clock signals different from the first pair to generate a second phase-difference result; and comparing the first and second phase-difference results to generate a control signal for adjusting delay of each delay element, wherein:

the control signal is generated to:

increase the delay applied by the delay elements if the first and second phase-difference results indicate that the delay should be increased; and decrease the delay if the first and second phase-difference results indicate that the delay should be decreased; and a null control signal is generated if the first and second phase-difference results do not agree.

25. A method for operating circuitry comprising a delay loop comprising a plurality of sequentially arranged delay elements, each adapted to generate a corresponding output clock signal, the method comprising:

characterizing phase difference between a first pair of the output clock signals to generate a first phase-difference result;

characterizing phase difference between a second pair of the output clock signals different from the first pair to generate a second phase-difference result; and comparing the first and second phase-difference results to generate a control signal for adjusting delay of each delay element, wherein:

the control signal is generated to:

increase the delay applied by the delay elements if the first and second phase-difference results indicate that the delay should be increased; and decrease the delay if the first and second phase-difference results indicate that the delay should be decreased; and a previous control signal is repeated if the first and second phase-difference results do not agree.

26. A method for operating circuitry comprising a delay loop comprising a plurality of sequentially arranged delay elements, each adapted to generate a corresponding output clock signal, the method comprising:

characterizing phase difference between a first pair of the output clock signals to generate a first phase-difference result;

characterizing phase difference between a second pair of the output clock signals different from the first pair to generate a second phase-difference result;

comparing the first and second phase-difference results to generate a control signal for adjusting delay of each delay element; and filtering the control signal generated by the comparator.

27. The method of claim 26, wherein:

the control signal is a digital control signal;

the filtering is digital filtering of the digital control signal; and further comprising converting the filtered digital control signal into an analog current control signal used to control the delays by the delay elements.

28. A method for operating circuitry comprising a delay loop comprising a plurality of sequentially arranged delay elements, each adapted to generate a corresponding output clock signal, the method comprising:

characterizing phase difference between a first pair of the output clock signals to generate a first phase-difference result;

characterizing phase difference between a second pair of the output clock signals different from the first pair to generate a second phase-difference result; and comparing the first and second phase-difference results to generate a control signal for adjusting delay of each delay element, wherein:

the delay loop is part of a receiver;

the output clock signals from the delay elements are used to sample a data signal received by the receiver; and the delay loop is adapted to control the delays by the delay elements in order to match bulk delay of the delay elements with a period of an input clock signal applied to the delay loop.

* * * * *

UNITED STATES PATENT AND TRADEMARK OFFICE
CERTIFICATE OF CORRECTION

| | | |
|---|---|---|
| PATENT NO. | : 7,212,048 B2 | Page 1 of 1 |
| APPLICATION NO. | : 11/138703 | |
| DATED | : May 1, 2007 | |
| INVENTOR(S) | : Peter C. Metz, Vladimir Sindalovsky and Lane A. Smith | |

It is certified that error appears in the above-identified patent and that said Letters Patent is hereby corrected as shown below:

On The Title Page: Item (56)
In References Cited replace "6,559,062 B1* 5/2003 Downey et al. ............ 375/376" with --6,959,062 B1* 10/2005 Stubbs ................ 375/376--.

Signed and Sealed this

Twenty-fourth Day of July, 2007

JON W. DUDAS
*Director of the United States Patent and Trademark Office*